US009959379B2

(12) United States Patent
Gupta et al.

(10) Patent No.: US 9,959,379 B2
(45) Date of Patent: May 1, 2018

(54) HYBRID COMPILATION FOR FPGA PROTOTYPING

(71) Applicant: Mentor Graphics Corporation, Wilsonville, OR (US)

(72) Inventors: Sanjay Gupta, Noida (IN); Praveen Shukla, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days. days.

(21) Appl. No.: 15/207,383

(22) Filed: Jul. 11, 2016

(65) Prior Publication Data

US 2017/0103156 A1 Apr. 13, 2017

Related U.S. Application Data

(60) Provisional application No. 62/238,641, filed on Oct. 7, 2015.

(51) Int. Cl.
*G06F 17/50* (2006.01)

(52) U.S. Cl.
CPC ...... *G06F 17/5054* (2013.01); *G06F 17/5072* (2013.01); *G06F 17/5081* (2013.01)

(58) Field of Classification Search
CPC ............. G06F 17/5054; G06F 17/5081; G06F 17/5072
See application file for complete search history.

(56) References Cited

U.S. PATENT DOCUMENTS 7,506,017 B1 * 3/2009 Dupenloup ............... G06F 7/53
708/620
9,449,133 B2 * 9/2016 Xue .................... G06F 17/5054

OTHER PUBLICATIONS

Doug Amos etal., "FPGA-Based Prototyping Methodology Manual", Chapter 3, 2011, Synopsys, Inc.
Ron Green, Five Challenges to FPGA-Based Prototyping:, EETimes, Sep. 19, 2014.

* cited by examiner

*Primary Examiner* — Naum B Levin

(57) ABSTRACT

Aspects of the disclosed technology relate to techniques of design implementation for FPGA prototyping. An initial FPGA-mapped netlist and a generic RTL design associated with the initial FPGA-mapped netlist are generated based on an original RTL (register-transfer level) design for a circuit design and optionally on verification-related features. Based on the initial FPGA-mapped netlist, the circuit design is partitioned into design partitions for implementing the circuit design across a plurality of FPGA chips. Final FPGA-mapped netlists are then generated based on the design partitions represented by the generic RTL design or by a combination of the generic RTL design and the initial FPGA-mapped netlist.

24 Claims, 11 Drawing Sheets

Flow chart
400

```
reg [3:0][7:0] mem [63:0][3:0];

function void writeMem(input [5:0] wAddr, input [1:0] sel1,
        input [1:0] sel2, input [7:0] data);
begin
 case(sel2)
  2'b00:
   mem[wAddr][sel1][0] = data;
  2'b01:
   mem[wAddr][sel1][1] = data;
  2'b10:
   mem[wAddr][sel1][2] = data;
  2'b11:
   mem[wAddr][sel1][3] = data;
  endcase
 end
endfunction always@(posedge clk)
begin
 case(sel1)
  2'b00:
   writeMem(wAddr1, sel1, sel2,data);
  2'b01:
   writeMem(wAddr2, sel1, sel2,data);
  2'b10:
   writeMem(wAddr3, sel1, sel2,data);
  2'b11:
   writeMem(wAddr4, sel1, sel2,data);
  endcase
 end
```

FIG. 5A

```
reg [31:0] mem [255:0];

always @ (posedge clk)

begin for(int i = 0; i < 4; i++)

if(rtlc_mem_be_n1123[i])

mem [ rtlc_mem__addr][ i*8+:8] = rtlc_mem_data[i*8+:8];

end
```

// "rtlc_mem__addr" is the simplified/optimized address for memory which will encapsulate and merge various address to single address.

// "rtlc_mem_data" is the simplified/optimized data for memory which will encapsulate and merge various "data" to single data.

// "rtlc_mem_be_n1123" is the simplified/optimized "enable/byte enable" for memory which will encapsulate and merge various complex "enable"

FIG. 5B

HYBRID COMPILATION FOR FPGA PROTOTYPING

RELATED APPLICATIONS

This application claims the benefit of U.S. Provisional Patent Application No. 62/238,641, filed on Oct. 7, 2015, and naming Sanjay Gupta et al. as inventors, which application is incorporated entirely herein by reference.

FIELD OF THE DISCLOSED TECHNOLOGY

The present disclosed technology relates to the field of circuit design verification technology. Various implementations of the disclosed technology may be particularly useful for FPGA-based prototyping.

BACKGROUND OF THE DISCLOSED TECHNOLOGY

Field programmable gate arrays (FPGAs) have experienced an exponential growth in the past thirty years. When FPGAs were first debuted in the mid- to late-eighties, an FPGA chip had less than 100 lookup tables (LUTs) and it was used as simple glue logic. Today, the logic gate equivalent capacity of a commercial FPGA chip reaches tens of millions gates. A median size application specific integrated circuit (ASIC) could be mapped into a single FPGA chip. Along with the ever-increasing capacity, FPGA architecture has also evolved. A large number of macro blocks such as memories, processors, high-speed inputs/outputs and clock synchronization circuitry are hard-wired within FPGA chips. This expands the range of applications that can be implemented in a single device. Moreover, FPGA chips can operate at speeds of hundreds of megahertz, close to an average ASIC clock rate. The above factors have resulted in the growth in popularity of FPGA prototyping.

An FPGA-based prototype allows hardware designers to develop and test their systems. Implementation errors and basic conceptual bugs are usually caught early in the verification process using simulation and emulation techniques. FPGA prototyping is typically deployed near the end of the verification process to catch system-level issues. For designs that rely heavily on commercial IP, an FPGA-based prototype is an ideal test platform for ensuring all IP components perform together.

An FPGA-based prototype can also serve as a vehicle for software development and validation. Embedded software has become the dominant part of the effort in modern System-on-Chip (SoC) design. FPGA prototyping provides software developers early access to a fully functioning hardware platform well before real silicon. This enables early software development tasks such as operating system (OS) integration and application testing. The increased productivity of software development and validation greatly accelerates a product's time-to-market.

Although the capacity of FPGAs has grown significantly over the years, they have not kept up with non-FPGA-based targeted integrated circuits (e.g., custom integrated circuits and ASICs). Not many modern designs fit in a single FPGA chip. As a result, designs often must be partitioned across multiple FPGA chips. Arbitrary partitioning may require a great deal of interconnect among chips and the resultant system may not perform as expected.

Besides partitioning, synthesis can also affect a prototype's performance. FPGA prototyping is usually performed after simulation-based verification is mostly finished and the register-transfer level (RTL) design is fairly mature. The synthesis process converts the RTL design into an FPGA-mapped netlist, which is then placed and routed in FPGA chip(s). One of the most important reasons to perform prototyping is to achieve the highest possible performance compared with other verification methods such as emulation. Poor synthesis can jeopardize this aim. Various techniques are employed in the synthesis process to meet both space and performance goals by inferring regular structures from a RTL design, optimizing them and efficiently mapping them into FPGA chips.

Mapping a design to FPGA prototype hardware is very time-consuming. As noted previously, the FPGA prototype is a much faster engine for running the RTL design model, but if the effort to setup the model is added, then the speed benefit may soon be eliminated. It is therefore desirable to develop a fast FPGA prototyping setup process without sacrificing the quality of the design implementation.

BRIEF SUMMARY OF THE DISCLOSED TECHNOLOGY

Aspects of the disclosed technology relate to techniques of design implementation for FPGA prototyping. In one aspect, there is a method comprising: generating, based on an original RTL (register-transfer level) design for a circuit design, an initial FPGA-mapped netlist and a generic RTL design, the generic RTL design being functionally equivalent to the initial FPGA-mapped netlist and maintaining one-to-one correspondence to the initial FPGA-mapped netlist in terms of design hierarchy for at least a part of the circuit design; partitioning, based on the initial FPGA-mapped netlist, the circuit design into design partitions for implementing the circuit design across a plurality of FPGA chips, each of the design partitions corresponding to a partition of the generic RTL design and to a partition of the initial FPGA-mapped netlist; and generating final FPGA-mapped netlists based on the design partitions, wherein the design partitions are represented by the partitions of the generic RTL design, or some of the design partitions are represented by the partitions of the generic RTL design and each of the rest of the design partitions is represented by a combination of the generic RTL design and the initial FPGA-mapped netlist.

The combination of the generic RTL design and the initial FPGA-mapped netlist may comprise a portion of one of the partitions of the generic RTL design and a portion of the corresponding partition of the initial FPGA-mapped netlist, the portion of one of the partitions of the generic RTL design corresponding to one or more modules of the generic RTL design, the portion of the corresponding partition of the initial FPGA-mapped netlist corresponding to a part of a module of the generic RTL design.

The method may further comprise processing the final FPGA-mapped netlists to generate FPGA configuration bitstreams for programming the plurality of FPGA chips, the processing comprising a place-and-route operation. The method may still further comprise programming the plurality of FPGA chips in to a prototype of the circuit design based on the FPGA configuration bitstreams.

The initial FPGA-mapped netlist and the generic RTL design may be generated based further on verification-related features. The verification-related features may comprise testbench components, assertions for debug, low power verification, or any combinations thereof.

The generating an initial FPGA-mapped netlist may be performed by a synthesis tool optimized for synthesis speed or a verification synthesis tool for FPGA-based emulators. The optimization may comprise employing a distributed synthesis technique.

The generating final FPGA-mapped netlists may be performed by a synthesis tool optimized for synthesis quality or a commercial FPGA synthesis implementation tool.

In another aspect, there is one or more computer-readable media storing computer-executable instructions for causing one or more processors to perform the above method.

In still another aspect, there is a system comprising one or more processors, the one or more processors programmed to perform the above method.

The disclosed technology speeds up the synthesis and partitioning process for FPGA prototyping while maintaining high quality of results. By contrast, conventional synthesis tools either must slow down the process to achieve quality of results or have to sacrifice quality of results for speed.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 5A illustrates an example of an original RTL description of memory write logic.

FIG. 5B illustrates an example of a generic RTL description of memory write logic.

DETAILED DESCRIPTION OF THE DISCLOSED TECHNOLOGY

General Considerations

Figure 1:
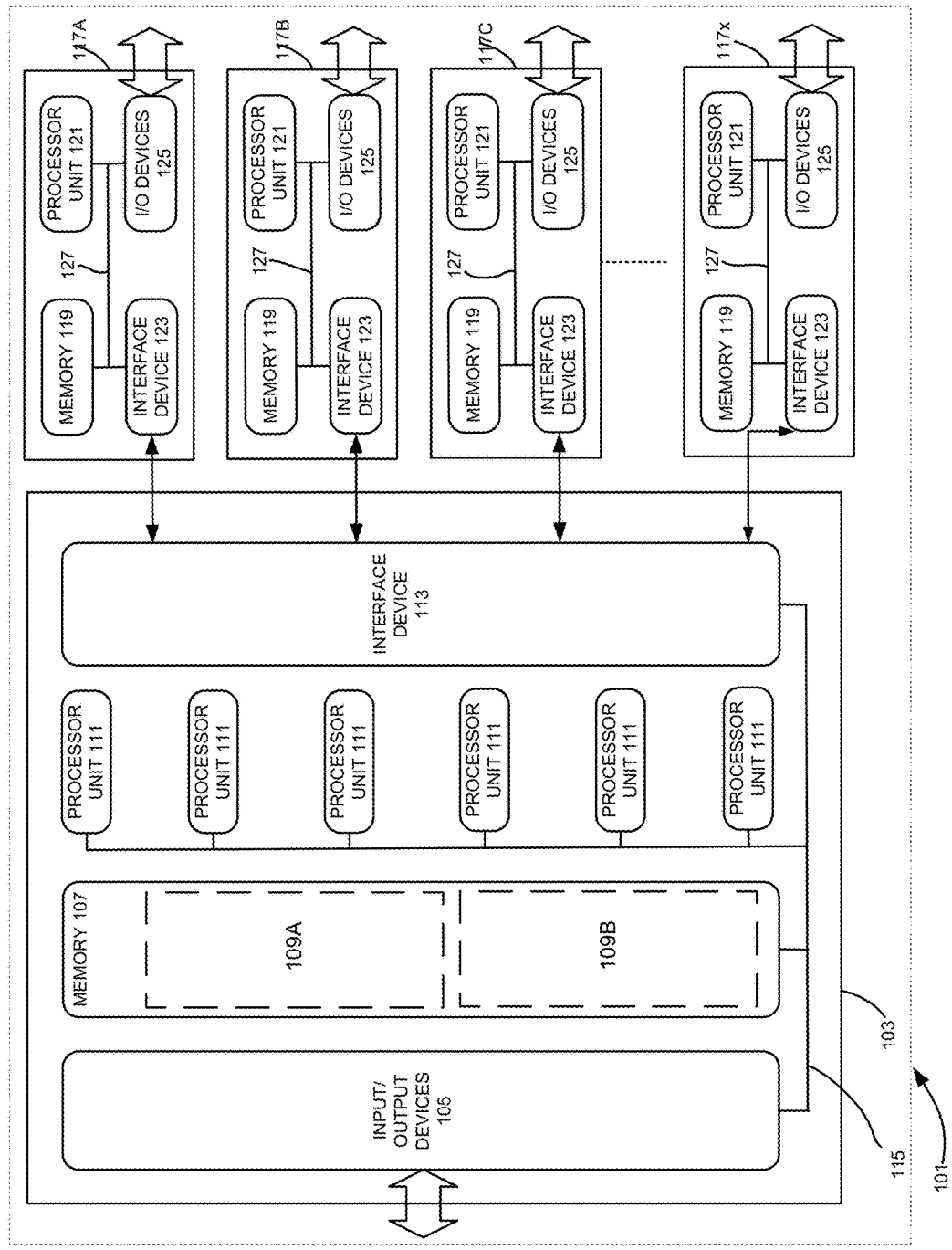
FIG. 1 illustrates an example of a computing system that may be used to implement various embodiments of the disclosed technology.

Various aspects of the present disclosed technology relate to techniques of design implementation for FPGA prototyping. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers (e.g., by one or more servers in a cloud-computing environment).

The detailed description of a method or a device sometimes uses terms like "generate," and "partition" to describe the disclosed method or the device function/structure. Such terms are high-level abstractions. The actual operations or functions/structures that correspond to these terms will vary depending on the particular implementation and are readily discernible by one of ordinary skill in the art.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
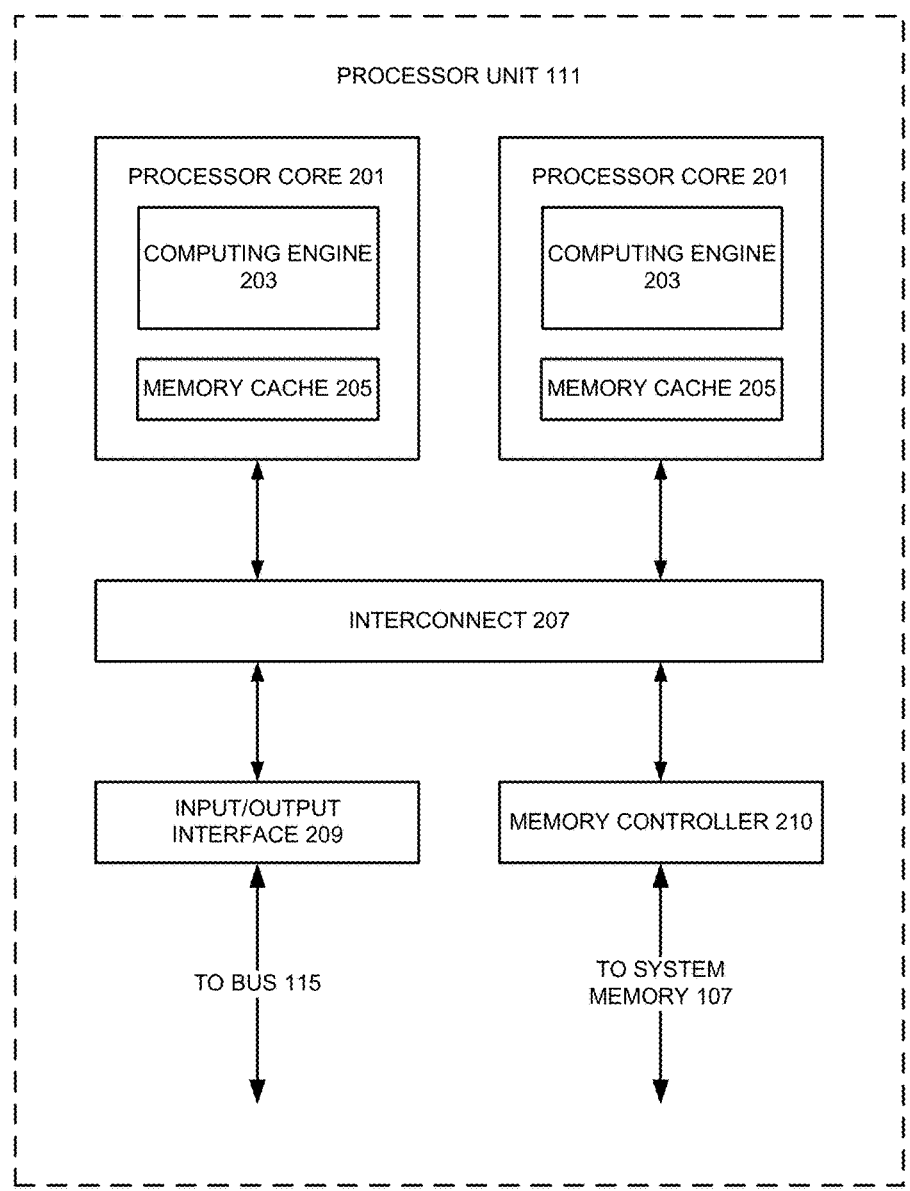
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/ Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

RTL Synthesis

RTL synthesis is an important operation in an FPGA prototyping process. At the register-transfer level (RTL), the most widely used hardware description languages are Verilog and VHDL, which specify the operations at each clock cycle. A typical RTL synthesis operation converts a RTL design into an FPGA mapped netlist through the following steps: 1) RTL elaboration that identifies and/or infers datapath operations and control logic; 2) technology-independent optimization; and 3) technology-dependent optimization and technology mapping.

An FPGA synthesis tool optimized for synthesis quality often employs an iterative synthesis optimization and mapping flow. Various across hierarchy optimizations and global timing optimizations in the whole design space are performed. This limits application of distributed synthesis techniques, which, along with the iterative nature of the flow, results in a relatively long synthesis time.

FPGAs have been used to implementing an emulator. In emulation, the RTL design is not close to being mature. A model derived from the RTL design is run on an emulator for debugging. The discovered bugs are fixed by revising the RTL design. This process is iterated for multiple times. In each round of the iteration, the RTL synthesis is needed. This dictates that the synthesis time is more important than the synthesis quality. Accordingly, the synthesis tool for FPGA-based emulation is usually optimized for synthesis time.

To speed up the synthesis speed, the synthesis tool used in emulation often uses a distributed approach: RTL modules are synthesized in parallel. Global across hierarchy optimizations are not aggressive. Moreover, a fully automated incremented synthesis flow may be adopted, allowing small modifications on the RTL design to be synthesized quickly.

Hybrid RTL Compilation Tool

Figure 3:
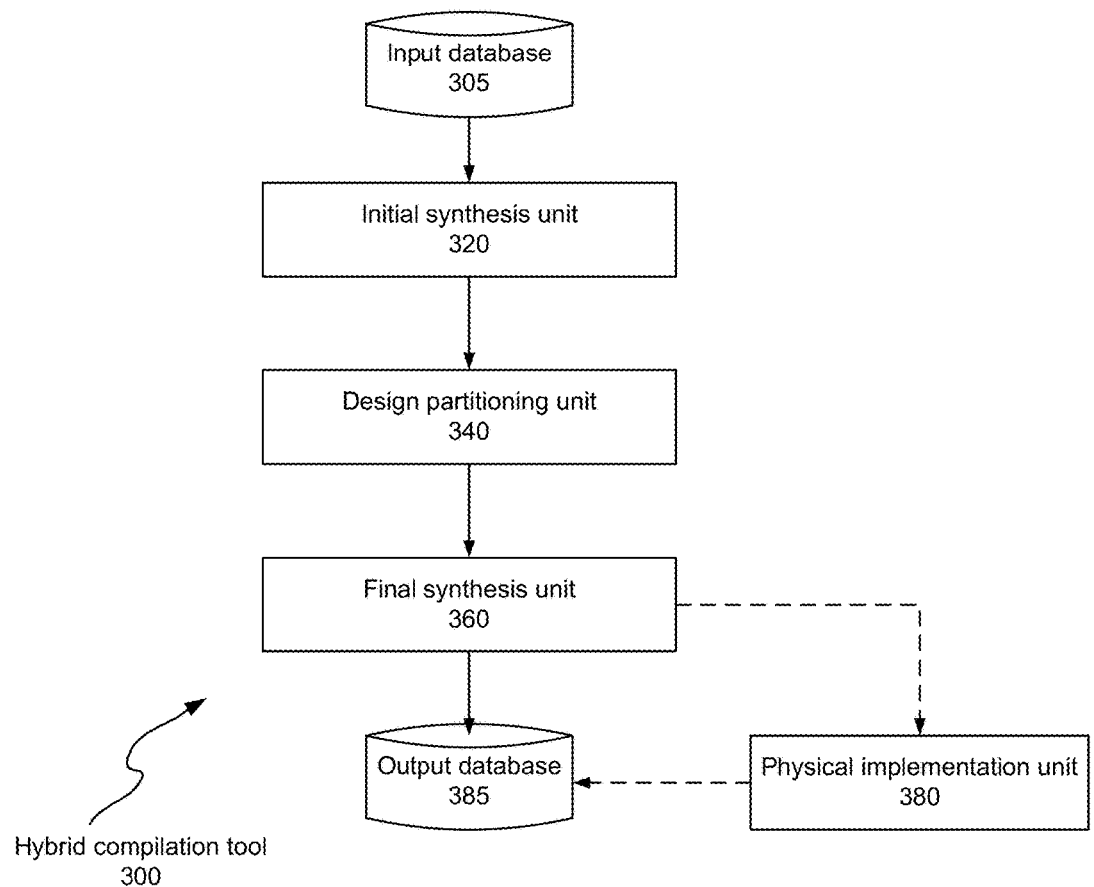
FIG. 3 illustrates an example of a hybrid RTL compilation tool that may be implemented according to various embodiments of the disclosed technology.

FIG. 3 illustrates an example of a hybrid RTL compilation tool 300 that may be implemented according to various embodiments of the disclosed technology. As seen in this figure, the hybrid RTL compilation tool 300 includes an initial synthesis unit 320, a design partitioning unit 340 and a final synthesis unit 360. Some implementations of the hybrid RTL compilation tool 300 may cooperate with (or incorporate) one or all of a physical implementation unit 380, an input database 305 and an output database 385.

As will be discussed in more detail below, the initial synthesis unit 320 generates, based on an original RTL (register-transfer level) design for a circuit design and optionally on verification-related features, an initial FPGA-mapped netlist and a generic RTL design. The generic RTL design is functionally equivalent to the initial FPGA-mapped netlist and maintains one-to-one correspondence to the initial FPGA-mapped netlist in terms of design hierarchy for at least a part of the circuit design. Based on the initial FPGA-mapped netlist, the design partitioning unit 340 partitions the circuit design into design partitions for implementing the circuit design across a plurality of FPGA chips. Each of the design partitions corresponds to a partition of the generic RTL design and to a partition of the initial FPGA-mapped netlist. The final synthesis unit 360 generates final FPGA-mapped netlists based on the design partitions. The design partitions are represented by the partitions of the generic RTL design, or some of the design partitions are represented by the partitions of the generic RTL design and each of the rest of the design partitions is represented by a combination of the generic RTL design and the initial FPGA-mapped netlist. The physical implementation unit 380 processes the final FPGA-mapped netlists to generate FPGA configuration bitstreams for programming the plurality of FPGA chips. The processing performed by the physical implementation unit 380 can comprise a place-and-route operation.

As previously noted, various examples of the disclosed technology may be implemented by one or more computing systems, such as the computing system illustrated in FIGS. 1 and 2. Accordingly, one or more of the initial synthesis unit 320, the design partitioning unit 340, the final synthesis unit 360, and the physical implementation unit 380 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the initial synthesis unit 320, the design partitioning unit 340, the final synthesis unit 360, and the physical implementation unit 380. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the initial synthesis unit 320, the design partitioning unit 340, the final synthesis unit 360, and the physical implementation unit 380 are shown as separate units in FIG. 3, a single computer (or a single processor within a master computer) or a single computer system may be used to implement all of these units at different times, or components of these units at different times.

With various examples of the disclosed technology, the input database 305 and the output database 385 may be implemented using any suitable computer readable storage device. That is, either of the input database 305 and the output database 385 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 385 are shown as separate units in FIG. 3, a single data storage medium may be used to implement some or all of these databases.

Hybrid RTL Compilation

Figure 4:
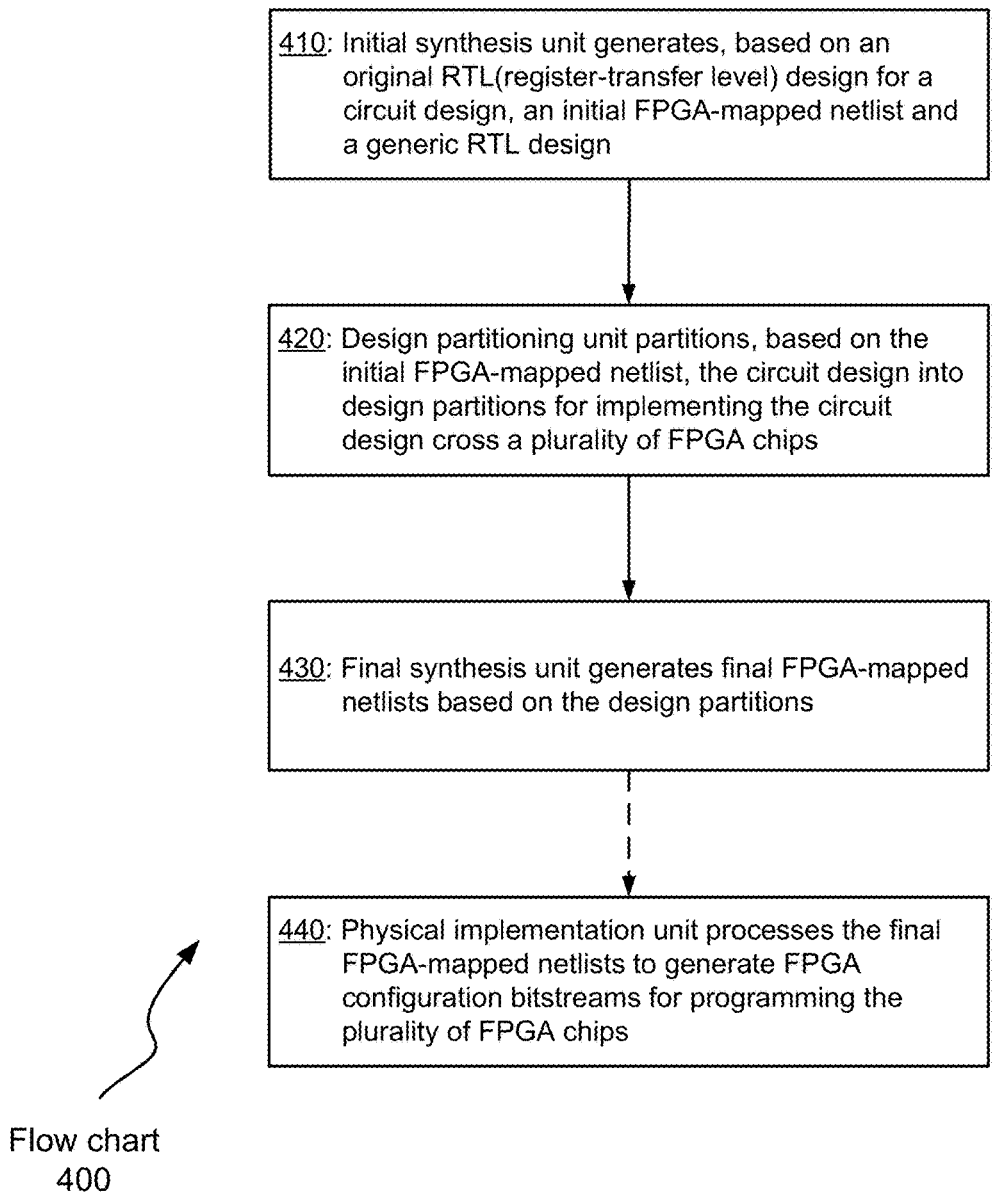
FIG. 4 illustrates a flow chart showing a process of hybrid RTL compilation that may be implemented according to various examples of the disclosed technology.

FIG. 4 illustrates a flowchart 400 showing a process of hybrid RTL compilation that may be implemented according to various examples of the disclosed technology. For ease of understanding, methods of hybrid RTL compilation that may be employed according to various embodiments of the disclosed technology will be described with reference to the hybrid RTL compilation tool 300 in FIG. 3 and the flow chart 400 illustrated in FIG. 4. It should be appreciated, however, that alternate implementations of a hybrid RTL compilation tool 300 may be used to perform the methods of hybrid RTL compilation illustrated by the flow chart 400 according to various embodiments of the disclosed technology. Likewise, the hybrid RTL compilation tool 300 may be employed to perform other methods of hybrid RTL compilation according to various embodiments of the disclosed technology.

In operation 410, the initial synthesis unit 320 generates, based on an original RTL (register-transfer level) design for a circuit design, an initial FPGA-mapped netlist and a generic RTL design. The generic RTL design is functionally equivalent to the initial FPGA-mapped netlist and maintains one-to-one correspondence to the initial FPGA-mapped netlist in terms of in terms of design hierarchy for at least a part of the circuit design.

Figure 8A:
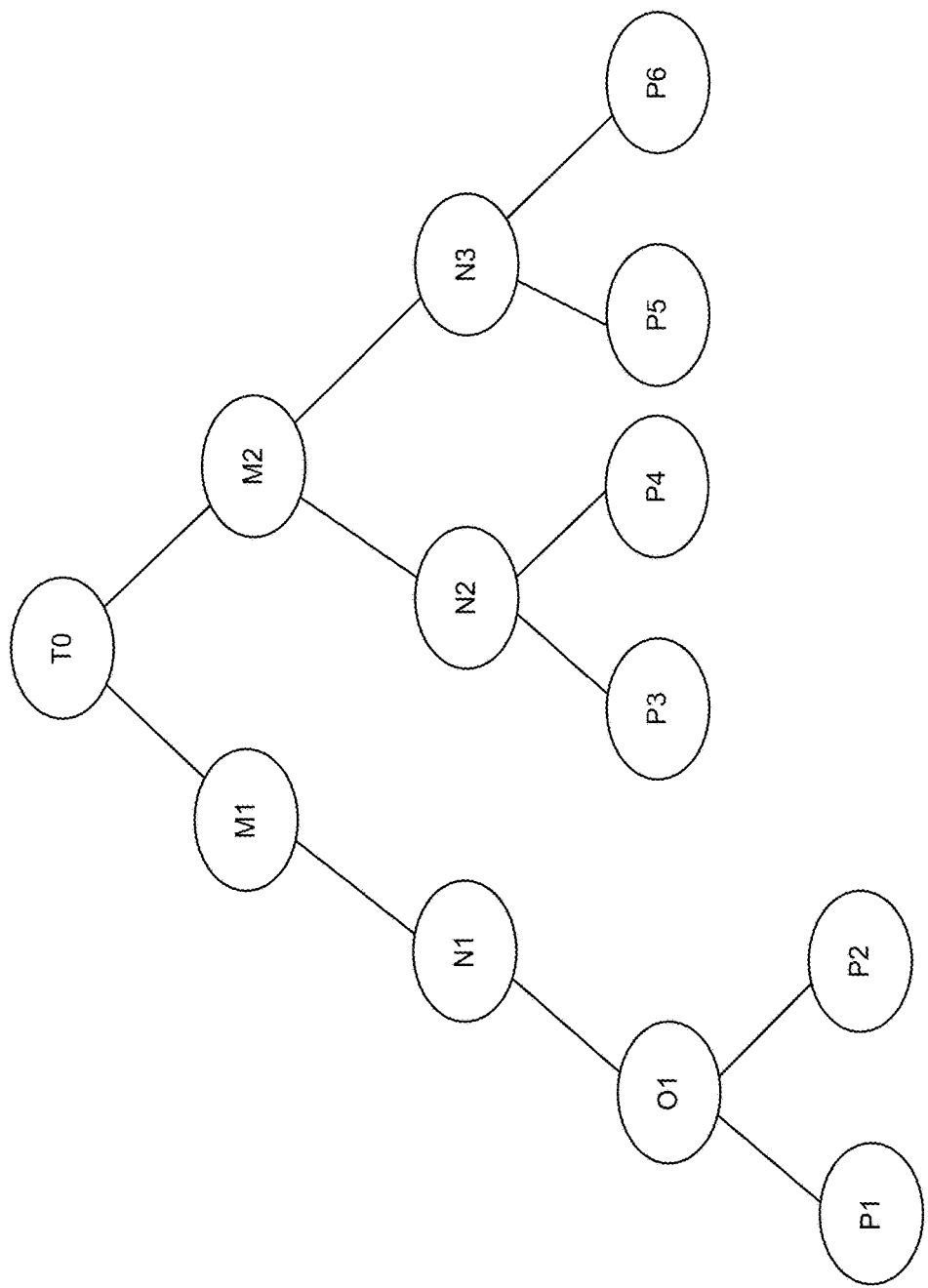
FIG. 8A illustrates an example of design hierarchy of the original RTL design or a portion of the original RTL design.
Figure 8B:
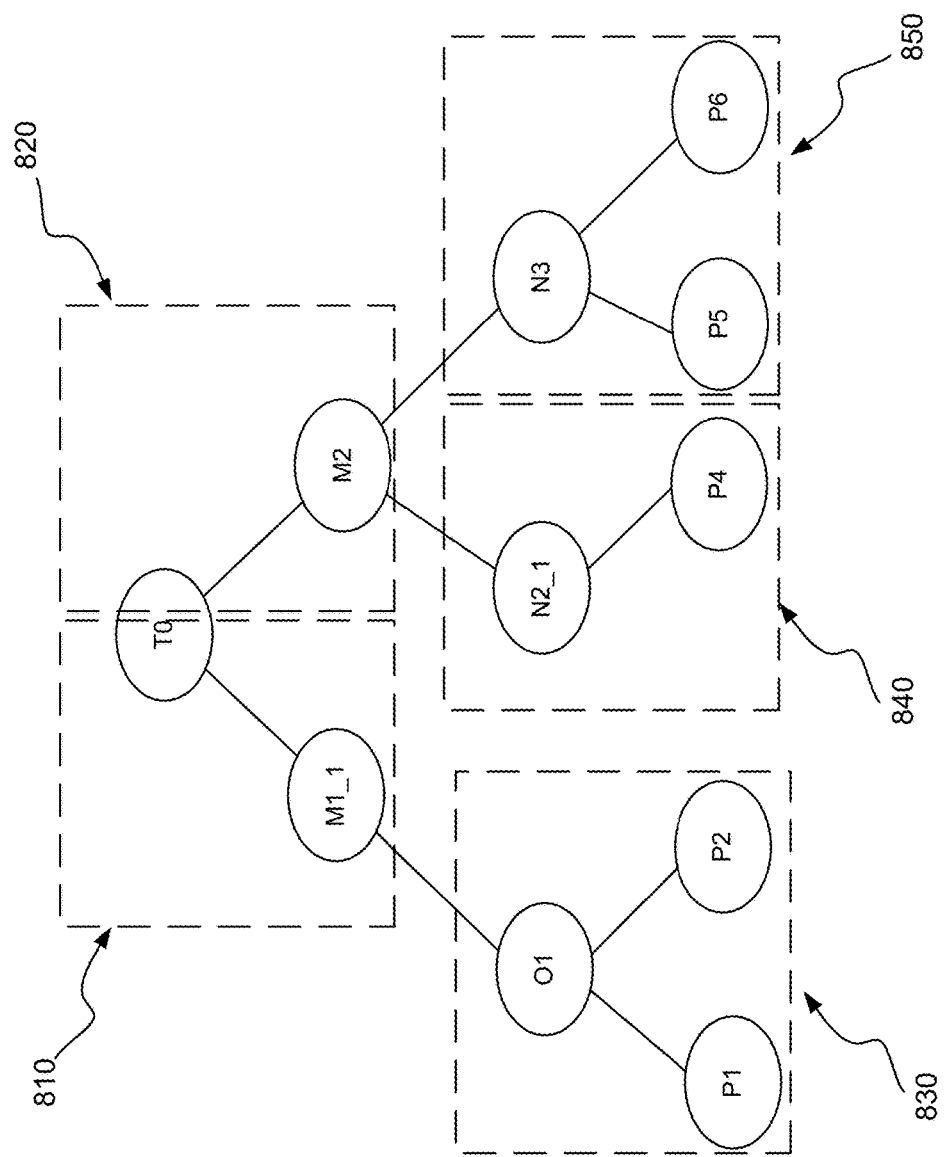
FIG. 8B illustrates an example of design hierarchy of the generic RTL design that may be generated for the original RTL design shown in FIG. 8A according to various examples of the disclosed technology.

FIG. 8A illustrates an example of design hierarchy of the original RTL design or a portion of the original RTL design. Each oval in the figure represents a module. Module T0 is at the top level while modules P1-P6 are at the bottom. FIG. 8B illustrates an example of design hierarchy of the generic RTL design that may be generated by the initial synthesis unit 320 for the original RTL design shown in FIG. 8A according to various examples of the disclosed technology. Not all of the original design hierarchy is preserved. Module P3 is "flattened out" in module N2. The new module corresponding to module N2 is referred to as N2_1. Similarly, module N1 is flattened out in module M1. The new module corresponding to module M1 is referred to as M1_1.

Figure 8C:
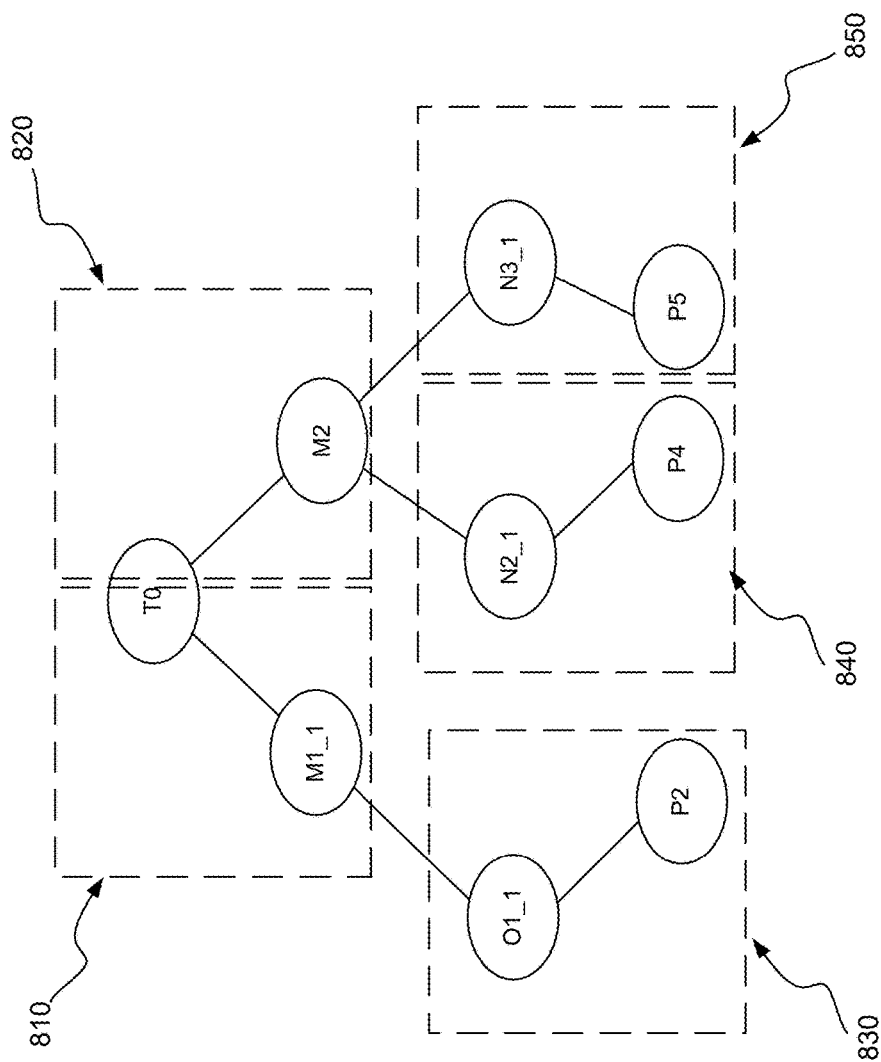
FIG. 8C illustrates an example of design hierarchy of the initial FPGA-mapped netlist that may be generated for the original RTL design shown in FIG. 8A according to various examples of the disclosed technology.

FIG. 8C illustrates an example of design hierarchy of the initial FPGA-mapped netlist that may be generated by the initial synthesis unit 320 for the original RTL design shown in FIG. 8A according to various examples of the disclosed technology. In this case, more original RTL modules (modules P1, P3, P6 and N1) are flattened out. By comparing FIGS. 8B and 8C, it is easy to see that generic RTL design in this case only partially maintains one-to-one correspondence to the initial FPGA-mapped netlist in terms of in terms of design hierarchy.

The initial FPGA-mapped netlist and the generic RTL design may be generated based further on verification-related features. The verification-related features may comprise assertions, low power design verification, test bench components like drivers and monitors, or any combinations thereof. The assertions may be described in assertion languages like SVA (System Verilog Assertion) and/or PSL (Property Specification Language). The low power design verification may be described in UPF (Unified Power Format) and/or CPF (Common Power Format).

Implementing the verification-related features into a prototype increases productivity and usability of the prototype solution. For example, adding assertions and monitors into a prototype increases the design visibility (observability and controllability) and debugging capabilities. The testbench components like drivers help to create stimuli for design-under-test. The support of low power design intent allows the prototype to be used for low power design verification in addition to traditional functional verification. Conventional FPGA synthesis tools have limited or no support of verification related features.

The generic RTL design is a functionally equivalent RTL design for user description (the original RTL design and maybe verification-related features). It will eventually be used for mapping the user description into FPGA chips. The generic RTL design may be generated by introducing a stage into the synthesis flow. This stage may be added after a language-independent generic netlist object model for the user description is created and before technology-dependent optimization and mapping that generates the initial FPGA-mapped netlist.

High level arithmetic or memory operations may be either preserved or extracted from the generic netlist object model as components/macros. After extraction, memory macro may be decompiled as signal declaration and read write operations captured in simple RTL. FIGS. 5A and 5B illustrate an example of complex memory inference from an original RTL description (FIG. 5A) to a generic RTL description (FIG. 5B). Here, memory inference needs traversal across functions, sharing write ports across functions simplified in the generic RTL design such that it will be easy to infer/map memories later. Other high level arithmetic macros like multiplier/adder may be decompiled as RTL expression in the generic RTL design, allowing them to be implemented optimally using dedicated FPGA technology specific resources available.

Similarly, state elements (e.g., flip-flops and latches) may be inferred from the user description (with its associated complexities) and then will be decompiled in simple RTL representation in the generic RTL design so that various FPGA technology-dependent optimizations can be used later for good quality of results.

Figure 6:
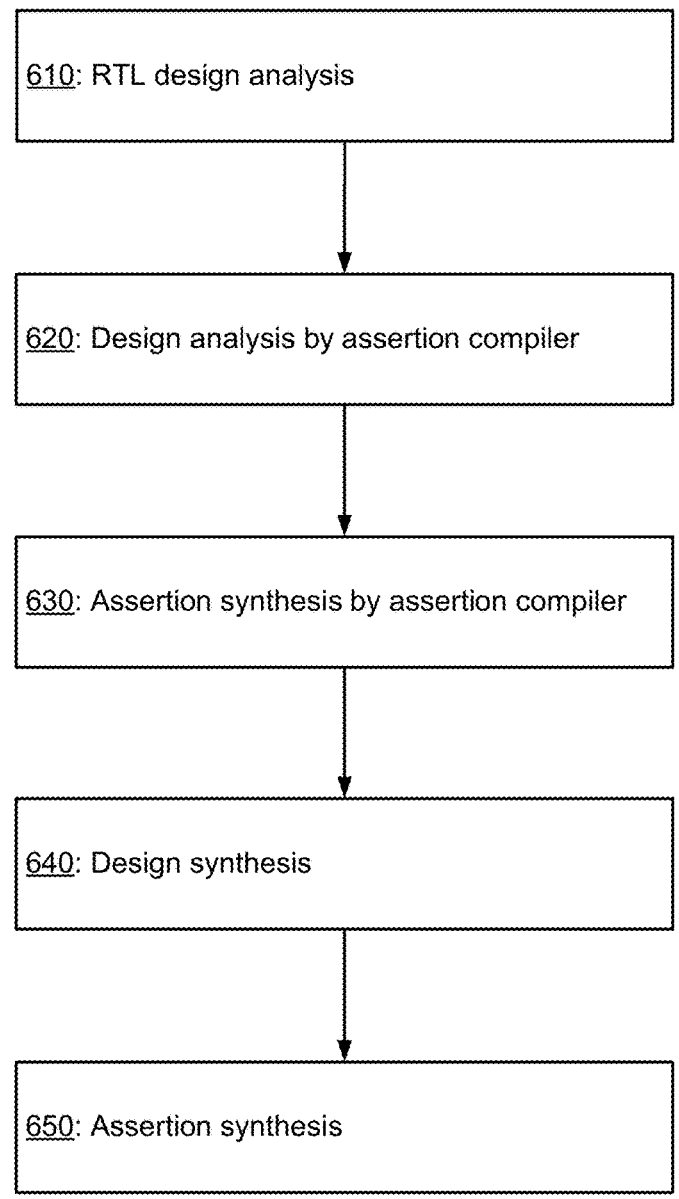
FIG. 6 illustrates an example of high-level compilation steps for an assertion-based verification flow that may be employed according to various embodiments of the disclosed technology.

FIG. 6 illustrates an example of high-level compilation steps for an assertion-based verification flow that may be employed by the initial synthesis unit 320 according to various embodiments of the disclosed technology. The generic RTL design generation may be performed additionally in operations 640 and 650 in conjunction with design and assertion syntheses.

Figure 7:
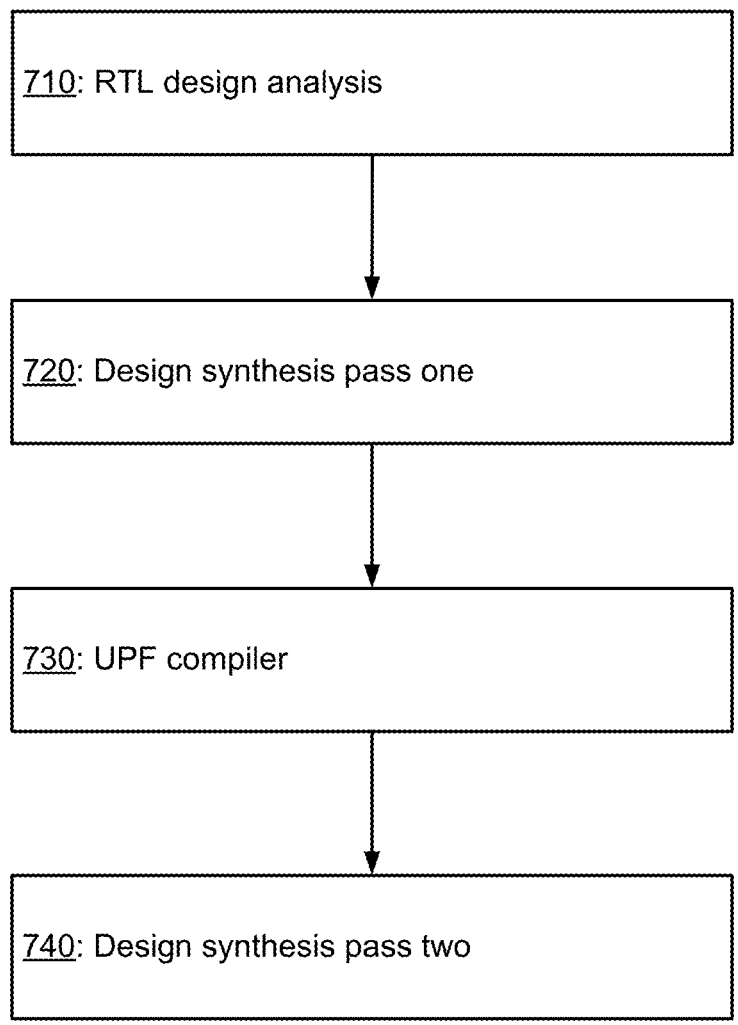
FIG. 7 illustrates an example of high level compilation steps for low power verification flow that may be employed according to various embodiments of the disclosed technology.

FIG. 7 illustrates an example of high level compilation steps for low power verification flow that may be employed by the initial synthesis unit 320 according to various embodiments of the disclosed technology. Low power design intent is captured in standard language like unified power format (UPF). The overall flow shown in FIG. 7 includes two synthesis steps (720 and 740) with a global UPF compilation step 730. The generic RTL design generation may be performed additionally in the step 740 in conjunction with design synthesis pass two that incorporates the low power design intent. The instrumentation needed to model low power functionality including state corruption, memory corruption, state retention, isolation, automatically inserted assertion logic for level shifter polarity/invalid power states, automatically inserted temporal assertion logic for checking valid power sequences for isolation/retention (like retention save->power off->power on->restore), automatically inserted coverage logic for power state table etc. is captured in the generic RTL design as simple RTL logic.

The initial synthesis unit 320 may be implemented by a synthesis tool optimized for synthesis speed. The optimization can comprise employing a distributed synthesis technique. A frontend synthesis tool for an emulator, such as the RTLC tool for Veloce available from Mentor Graphics Corporation, Wilsonville, Oreg., is usually optimized for speed, as discussed previously. Such a tool may be enhanced for generating the generic RTL design and for supporting various verification implementations.

In operation 420, the design partitioning unit 340 partitions, based on the initial FPGA-mapped netlist, the circuit design into design partitions for implementing the circuit design across a plurality of FPGA chips. Each of the design partitions corresponds to a partition of the generic RTL design and to a partition of the initial FPGA-mapped netlist. Being FPGA-mapped, the initial FPGA-mapped netlist enables the design partitioning unit 340 to be aware of FPGA resources. High quality of partitioning can thus be achieved. The design partitioning unit 340 may be implemented by the Wasga partitioning tool, Flexras, or by the partitioning tool in the ACE Compiler, Auspy Development, of which both are now owned by Mentor Graphics Corporation, Wilsonville, Oreg.

In the example shown in FIG. 8C, the design represented by the initial FPGA-mapped netlist is partitioned into five design partitions 810-850 shown by squares with dotted lines. The corresponding design partitions represented by the generic RTL design are show in FIG. 8B.

In operation 430, the final synthesis unit 360 generates final FPGA-mapped netlists based on the design partitions. The design partitions represented by the partitions of the generic RTL design are usually used by the final synthesis unit 360. In some cases, the final synthesis unit 360 uses some of the design partitions represented by the partitions of the generic RTL design and the rest of the design partitions represented by a combination of the generic RTL design and the initial FPGA-mapped netlist. In the case illustrated by FIGS. 8B and 8C, for example, the partitions 830-850 consist of whole modules and are represented only by the partitions of the generic RTL design. The top module T0 is split into the two design partitions 810 and 820. The final synthesis unit 360 uses a combination of the module M1_1 represented by the generic RTL design and a part of the module T0 represented by the initial FPGA-mapped netlist for synthesizing the design partition 810, and a combination of the module M2 represented by the generic RTL design and the rest of the module T0 represented by the initial FPGA-mapped netlist for synthesizing the design partition 820.

The design partitions may be synthesized in parallel. Each of the final FPGA-mapped netlists will be implemented in one of the plurality of FPGA chips. The final synthesis unit 360 may be implemented by a synthesis tool optimized for synthesis quality such as synthesis tools in Precision RTL Compiler from Mentor Graphics, Synplify from Synopsys, Quartus from Altera, or Vivado from Xilinx.

In operation 440, the physical implementation unit 380 processes the final FPGA-mapped netlists to generate FPGA configuration bitstreams for programming the plurality of FPGA chips. The processing performed by the physical implementation unit 380 comprises a place-and-route operation. Placement determines the location of each element in the final FPGA-mapped netlists, and routing connects all signal paths using the available on-chip programmable interconnects. A FPGA configuration bitstream is then generated for each of the plurality of FPGA chips. The physical implementation unit 380 may be implemented by a back-end tool in the above-listed commercial tools. The generated FPGA configuration bitstreams may then be used to program the plurality of FPGA chips into a prototype of the circuit design.

Some or all of the above operations may be repeated for optimization. The disclosed technology allows for incremental compilation. If small design changes do not impact partitioning decisions, the initial synthesis unit 320 performs a quick incremental synthesis and one or more partitions of the generic RTL design that include changed user module(s) are modified. Original partitions will be reused. The modified one or more partitions of the generic RTL design are resynthesized and placed and routed. The FPGA configuration bitstreams for the other partitions of the generic RTL design not impacted will be reused.

If design changes require re-partitioning, the initial synthesis unit 320 performs an incremental synthesis and generated a modified initial FPGA-mapped netlist. Repartitioning is performed based on the modified initial FPGA-mapped netlist. Only impacted partitions of the generic RTL design are resynthesized and placed and routed.

The disclosed technology speeds up the synthesis and partitioning process for FPGA prototyping while maintaining high quality of results. By contrast, conventional synthesis tools either must slow down the process to achieve quality of results or have to sacrifice quality of results for speed.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. One or more computer-readable media storing computer-executable instructions for causing one or more processors to perform a method, the method comprising:
   generating, based on an original RTL (register-transfer level) design for a circuit design, an initial FPGA-mapped netlist and a generic RTL design, the generic RTL design being functionally equivalent to the initial FPGA-mapped netlist and maintaining one-to-one correspondence to the initial FPGA-mapped netlist in terms of design hierarchy for at least a part of the circuit design;
   partitioning, based on the initial FPGA-mapped netlist, the circuit design into design partitions for implementing the circuit design across a plurality of FPGA chips, each of the design partitions corresponding to a partition of the generic RTL design and to a partition of the initial FPGA-mapped netlist; and
   generating final FPGA-mapped netlists based on the design partitions, wherein the design partitions are represented by the partitions of the generic RTL design, or some of the design partitions are represented by the partitions of the generic RTL design and each of the rest of the design partitions is represented by a combination of the generic RTL design and the initial FPGA-mapped netlist.

2. The one or more computer-readable media recited in claim 1, wherein the combination of the generic RTL design and the initial FPGA-mapped netlist comprises a portion of one of the partitions of the generic RTL design and a portion of the corresponding partition of the initial FPGA-mapped netlist, the portion of one of the partitions of the generic RTL design corresponding to one or more modules of the generic RTL design, the portion of the corresponding partition of the initial FPGA-mapped netlist corresponding to a part of a module of the generic RTL design.

3. The one or more computer-readable media recited in claim 1, wherein the method further comprises:
   processing the final FPGA-mapped netlists to generate FPGA configuration bitstreams for programming the plurality of FPGA chips, the processing comprising a place-and-route operation.

4. The one or more computer-readable media recited in claim 1, wherein the generating final FPGA-mapped netlists is performed by a synthesis tool optimized for synthesis quality.

5. The one or more computer-readable media recited in claim 1, wherein the generating final FPGA-mapped netlists is performed by a commercial FPGA synthesis implementation tool.

6. The one or more computer-readable media recited in claim 1, wherein the generating an initial FPGA-mapped netlist is performed by a synthesis tool optimized for synthesis speed.

7. The one or more computer-readable media recited in claim 6, wherein the optimization comprises employing a distributed synthesis technique.

8. The one or more processor-readable storage device recited in claim 1, wherein the generating an initial FPGA-mapped netlist is performed by a modified verification synthesis tool for FPGA-based emulators.

9. The one or more processor-readable storage device recited in claim 1, wherein the initial FPGA-mapped netlist and the generic RTL design are generated based further on verification-related features.

10. The one or more processor-readable storage device recited in claim 9, wherein the verification-related features comprise testbench components, assertions for debug, low power verification, or any combinations thereof.

11. A method, executed by at least one processor of a computer, comprising:
    generating, based on an original RTL (register-transfer level) design for a circuit design, an initial FPGA-mapped netlist and a generic RTL design, the generic RTL design being functionally equivalent to the initial FPGA-mapped netlist and maintaining one-to-one correspondence to the initial FPGA-mapped netlist in terms of design hierarchy for at least a part of the circuit design;
    partitioning, based on the initial FPGA-mapped netlist, the circuit design into design partitions for implementing the circuit design across a plurality of FPGA chips, each of the design partitions corresponding to a partition of the generic RTL design and to a partition of the initial FPGA-mapped netlist; and
    generating final FPGA-mapped netlists based on the design partitions, wherein the design partitions are represented by the partitions of the generic RTL design, or some of the design partitions are represented by the partitions of the generic RTL design and each of the rest of the design partitions is represented by a combination of the generic RTL design and the initial FPGA-mapped netlist.

12. The method recited in claim 11, further comprising:
    processing the final FPGA-mapped netlists to generate FPGA configuration bitstreams for programming the plurality of FPGA chips, the processing comprising a place-and-route operation.

13. The method recited in claim 12, further comprising:
    programming the plurality of FPGA chips based on the FPGA configuration bitstreams.

14. The method recited in claim 11, wherein the combination of the generic RTL design and the initial FPGA-mapped netlist comprises a portion of one of the partitions of the generic RTL design and a portion of the corresponding partition of the initial FPGA-mapped netlist, the portion of one of the partitions of the generic RTL design corresponding to one or more modules of the generic RTL design, the portion of the corresponding partition of the initial FPGA-mapped netlist corresponding to a part of a module of the generic RTL design.

15. The method recited in claim 11, wherein the generating final FPGA-mapped netlists is performed by a synthesis tool optimized for synthesis quality.

16. The method recited in claim 11, wherein the generating final FPGA-mapped netlists is performed by a commercial FPGA synthesis implementation tool.

17. The method recited in claim 11, wherein the generating an initial FPGA-mapped netlist is performed by a synthesis tool optimized for synthesis speed.

18. The method recited in claim 11, wherein the generating an initial FPGA-mapped netlist is performed by a modified verification synthesis tool for FPGA-based emulators.

19. The method recited in claim 11, wherein the initial FPGA-mapped netlist and the generic RTL design are generated based further on verification-related features.

20. The method recited in claim 19, wherein the verification-related features comprise testbench components, assertions for debug, low power verification, or any combinations thereof.

21. A system comprising:
one or more processors, the one or more processors programmed to perform a method, the method comprising:
generating, based on an original RTL(register-transfer level) design for a circuit design, an initial FPGA-mapped netlist and a generic RTL design, the generic RTL design being functionally equivalent to the initial FPGA-mapped netlist and maintaining one-to-one correspondence to the initial FPGA-mapped netlist in terms of design hierarchy for at least a part of the circuit design;
partitioning, based on the initial FPGA-mapped netlist, the circuit design into design partitions for implementing the circuit design across a plurality of FPGA chips, each of the design partitions corresponding to a partition of the generic RTL design and to a partition of the initial FPGA-mapped netlist; and
generating final FPGA-mapped netlists based on the design partitions, wherein the design partitions are represented by the partitions of the generic RTL design, or some of the design partitions are represented by the partitions of the generic RTL design and each of the rest of the design partitions is represented by a combination of the generic RTL design and the initial FPGA-mapped netlist.

22. The system recited in claim 21, wherein the method further comprises:
processing the final FPGA-mapped netlists to generate FPGA configuration bitstreams for programming the plurality of FPGA chips, the processing comprising a place-and-route operation; and
programming the plurality of FPGA chips based on the FPGA configuration bitstreams.

23. The system recited in claim 21, wherein the initial FPGA-mapped netlist and the generic RTL design are generated based further on verification-related features.

24. The system recited in claim 23, wherein the verification-related features comprise testbench components, assertions for debug, low power verification, or any combinations thereof.

* * * * *